United States Patent
Matsuda et al.

(10) Patent No.: US 8,354,896 B2
(45) Date of Patent: Jan. 15, 2013

(54) ACOUSTIC WAVE DEVICE, TRANSMISSION APPARATUS, AND ACOUSTIC WAVE DEVICE MANUFACTURING METHOD

(75) Inventors: Satoru Matsuda, Kawasaki (JP); Michio Miura, Kawasaki (JP); Takashi Matsuda, Kawasaki (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 228 days.

(21) Appl. No.: 12/511,162

(22) Filed: Jul. 29, 2009

(65) Prior Publication Data
US 2010/0188173 A1    Jul. 29, 2010

(30) Foreign Application Priority Data
Jul. 31, 2008    (JP) .................. 2008-198431

(51) Int. Cl.
*H03H 9/00* (2006.01)
*H01L 41/08* (2006.01)
(52) U.S. Cl. .................... 333/193; 310/313 B
(58) Field of Classification Search .................. 333/133, 333/193, 194, 195, 196; 310/313 B
See application file for complete search history.

(56) References Cited

U.S. PATENT DOCUMENTS

| | | | |
|---|---|---|---|
| 3,992,760 A | 11/1976 | Roberts | |
| 4,243,960 A | 1/1981 | White et al. | |
| 5,320,865 A | 6/1994 | Nakahata et al. | |
| 6,516,503 B1 | 2/2003 | Ikada et al. | |
| 6,557,225 B2 | 5/2003 | Takata et al. | |
| 6,601,276 B2 | 8/2003 | Barber | |
| 7,322,093 B2 | 1/2008 | Kadota et al. | |
| 7,327,071 B2 | 2/2008 | Nishiyama et al. | |
| 7,486,001 B2 * | 2/2009 | Kando ...................... 310/313 R |
| 7,522,020 B2 * | 4/2009 | Kando .......................... 333/193 |
| 7,550,898 B2 | 6/2009 | Kadota et al. | |
| 7,573,178 B2 * | 8/2009 | Inoue et al. ............... 310/313 R |
| 7,915,786 B2 * | 3/2011 | Matsuda et al. .......... 310/313 A |

(Continued)

FOREIGN PATENT DOCUMENTS
CN    1322059 A    11/2001
(Continued)

OTHER PUBLICATIONS

Walsh et al., Nanoindentation of silicon nitride: A multimillion-atom molecular dynamics study, Jan. 2003, vol. 82, No. 1, 3 pages.*

(Continued)

*Primary Examiner* — Dean O Takaoka
(74) *Attorney, Agent, or Firm* — Chen Yoshimura LLP

(57) ABSTRACT

An acoustic wave device includes a plurality of acoustic wave devices each including a substrate made of a piezoelectric material, a pair of interdigital electrodes formed on the substrate, each of the interdigital electrodes including a plurality of electrode fingers, and an adjustment medium. The adjustment medium includes at least a single layer and is formed on at least a part of the pair of the interdigital electrodes. The adjustment medium further includes at least one thick portion and a thin portion, the thin portion being null or thinner than the thick portion, a total area of the at least one thick portion in a region covering the pair of interdigital electrodes being determined according to a predetermined characteristic value, wherein the plurality of acoustic wave devices include at least two acoustic wave devices that differ from each other with respect to the size of the total area of the at least one thick portion of the adjustment medium.

17 Claims, 12 Drawing Sheets

U.S. PATENT DOCUMENTS

| | | |
|---|---|---|
| 2006/0138902 A1 | 6/2006 | Kando |
| 2006/0290233 A1 | 12/2006 | Nishiyama et al. |
| 2007/0018536 A1 | 1/2007 | Kadota et al. |
| 2007/0210676 A1* | 9/2007 | Matsuda et al. ............. 310/326 |
| 2007/0222337 A1 | 9/2007 | Kadota et al. |
| 2007/0284965 A1 | 12/2007 | Kadota et al. |
| 2008/0074212 A1* | 3/2008 | Matsuda et al. ............. 333/195 |
| 2008/0160178 A1 | 7/2008 | Nishiyama et al. |
| 2008/0266023 A1 | 10/2008 | Tanaka |
| 2009/0102318 A1 | 4/2009 | Kando |
| 2010/0244624 A1* | 9/2010 | Matsuda et al. .......... 310/313 B |

FOREIGN PATENT DOCUMENTS

| | | |
|---|---|---|
| CN | 1926762 A | 3/2007 |
| CN | 1938946 A | 3/2007 |
| JP | 01231411 A | 9/1989 |
| JP | 02-301210 A | 12/1990 |
| JP | H08-032397 A | 2/1996 |
| JP | 2000-341068 A | 12/2000 |
| JP | 2006-238211 A | 9/2006 |
| JP | 2007-036670 A | 2/2007 |
| WO | 2005/069486 A1 | 7/2005 |
| WO | WO 2005/083881 A1 | 9/2005 |
| WO | 2005/093949 A1 | 10/2005 |

OTHER PUBLICATIONS

Applicants bring the attention of the Examiner to the following pending U.S. Appl. No. 12/647,071, filed Dec. 24, 2009. The corresponding U.S. publication is listed in the U.S. Patent Application Publication No. 6 above.

Japanese Office Action dated on Jun. 21, 2011, in a counterpart Japanese patent application No. 2009-074041 of the related U.S. Appl. No. 12/647,071 mentioned above. Concise explanation of relevance: the Japanese Office Action rejects claims in the Japanese application in view of Foreign Patent document Nos. 1-5 above.

Chinese Office Action in a counterpart Chinese Patent Application No. 200910160971.1, dated Oct. 21, 2011.

Chinese Office Action (of the related U.S. Application No. 12/647,071) dated Jun. 4, 2012 in a counterpart Chinese Patent Application No. 200910261121.0.

* cited by examiner

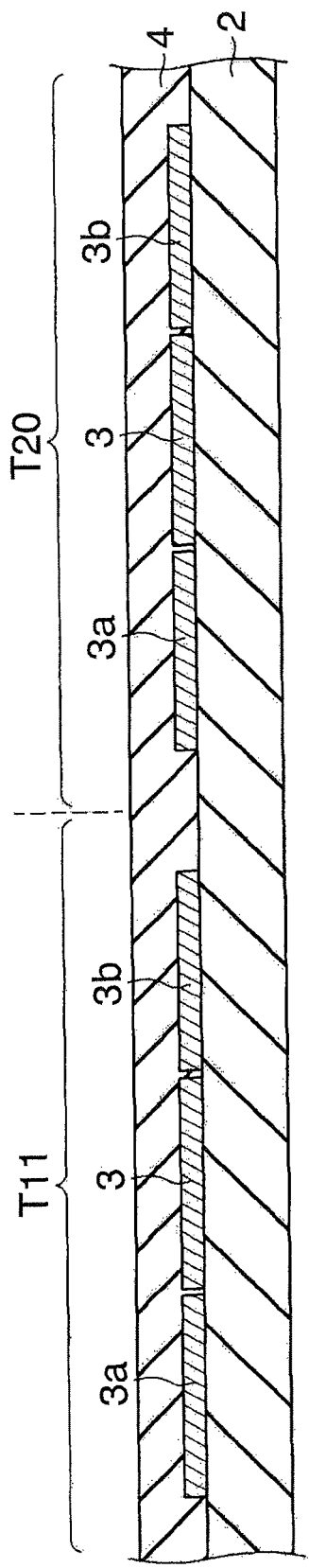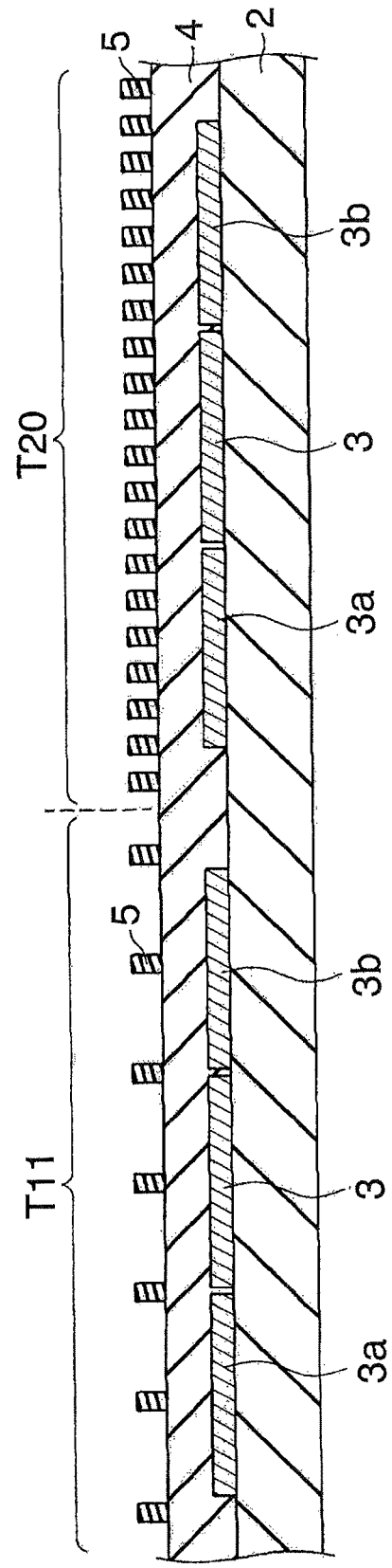

ACOUSTIC WAVE DEVICE, TRANSMISSION APPARATUS, AND ACOUSTIC WAVE DEVICE MANUFACTURING METHOD

CROSS-REFERENCE TO RELATED APPLICATIONS

This application is based upon and claims the benefit of priority of the prior Japanese Patent Application No. 2008-198431, filed on Jul. 31, 2008, the entire contents of which are incorporated herein by reference.

FIELD

The embodiments discussed herein are related to a surface acoustic wave device or a boundary wave device.

BACKGROUND

A surface acoustic wave (SAW) device is well known as a device of application of acoustic waves. A SAW device is utilized in various circuits for processing radio signals across a frequency band ranging from 45 MHz to 2 GHz typically used for cellular phones, etc. Examples of the various circuits include transmission band-pass filters, reception band-pass filters, local oscillation filters, antenna duplexers, IF filters, and FM modulators.

In recent years, the acoustic wave devices are required to improve the characteristics such as high suppression over frequencies out of the band in use and an increase of a temperature stability due to demands of higher performances and downsizing of cellular phones. The method for improving temperature stability has been developed in which a dielectric such as $SiO_2$ is formed on an interdigital electrode of a piezoelectric substrate. Furthermore, boundary-wave devices have been developed to downsize the devices using the boundary-wave devices. The boundary-wave device has an additional dielectric layer on the dielectric layer formed on the interdigital electrode due to trap energy between the surfaces of the additional dielectric layer and the piezoelectric substrate.

Almost of the acoustic wave devices sometimes have a common problem of variations of frequency which is one of the characteristics of the acoustic wave device and the variations of frequency are caused by manufacturing variations. To solve this problem, various methods for adjusting a frequency have been disclosed (e.g., refer to Japanese Open-laid Patent Publication No. 02-301210 and International Publication 2005-083881).

As an example, Japanese Open-laid Patent Publication No. 02-301210 has proposed the method in which the frequency is adjusted by forming a SiN film on an interdigital electrode, a reflector, and a piezoelectric substrate with, for example, plasma CVD. Alternatively, International Publication Pamphlet No. WO 2005/083881 has proposed the method in which the frequency is adjusted by forming a SiN film on an $SiO_2$ film formed on the interdigital electrodes and thinning the thickness of the SiN film by a physical etching method or increasing the thickness by a sputtering method.

Further, International Publication Pamphlet No. WO 2005/093949 has proposed has proposed the frequency adjustment method by adjusting a thickness of second medium in a boundary wave device having inter-digital transducer electrodes disposed at boundary between the first and the second mediums.

SUMMARY

According to an aspect of the invention, a first acoustic wave device includes a second acoustic wave device. The second acoustic wave device includes a substrate made of a piezoelectric material, a pair of interdigital electrodes formed on the substrate, each of the interdigital electrodes including a plurality of electrode fingers, and a adjustment medium. The adjustment medium includes at least a single layer and is formed on at least a part of the pair of the interdigital electrodes. The adjustment medium further includes a thick portion and a thin portion being null or thinner than the thick portion, an area of the thick portion opposed to a region being determined according to a predetermined characteristic value, the area including the interdigital electrodes and a plurality of spaces between the electrode fingers adjacent each other.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIGS. 8A and 8B are diagrams depicting a manufacturing process of an acoustic wave device formed on a wafer;

DESCRIPTION OF EMBODIMENTS

Figure 1A:
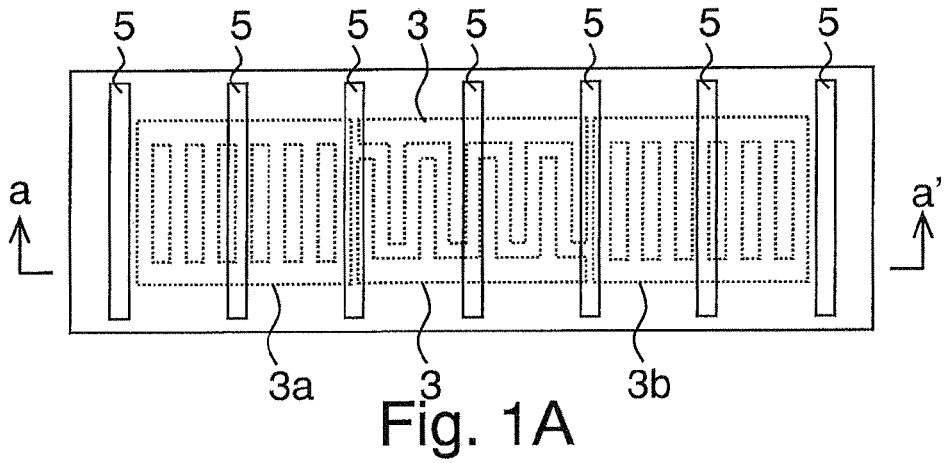
FIG. 1A is an example diagram of a plan view of an acoustic wave device of a first embodiment.

Hereinafter, a piezoelectric resonator or an acoustic wave device including a plurality of a piezoelectric resonators is referred to as an acoustic wave device, while individual designations may be used as necessary.

As described previously, there is a method for adjusting frequency characteristics by controlling the thickness of a medium through etching the medium covering an electrode in a depth direction. For example, to control the variation of the frequency characteristics between a plurality of acoustic wave devices formed on a single wafer to be within a desired range by such a method, part of the acoustic wave devices on a wafer needs to be selected and the thickness of the medium of the selected part needs to be controlled. For example, the thickness of the medium needs to be adjusted by masking part of a wafer plane and etching part of the upper portion of the medium in a depth direction. Thus, for example, each chip is etched by different amounts. In this case, to control the frequency distribution in a wafer plane to be within a desired range, each chip is masked and film formation and etching may have to be repeatedly conducted several times. Consequently, a problem such as an increase in the number of processing steps arises.

An example of embodiments may relate to an acoustic wave devices having an adjustment medium for frequency adjustment disposed on an acoustic excitation region where the acoustic wave is excited. The area of adjustment medium allows the frequency such as a resonant and an anti-resonant frequencies, a center frequency (for example, of a band pass filter) to be adjusted to close to a desired frequency. In detail, the amount of adjusted frequency may be changed substantially according to the ratio of the area of the adjustment medium to the area of the acoustic excitation region (hereinafter, the area is referred to as "area T").

The example described previously is explained. A plurality of acoustic wave devices usually are fabricated on a single wafer. The characteristics of the all acoustic wave devices are not same or close to the desired characteristic and the variation of the characteristics has a tendency depending on the portions in the wafer on which the acoustic wave devices are formed. Therefore, the frequency adjustment described previously may allow each of the characteristics to adjust to close the desired individual characteristics such as the resonant or the anti-resonant frequencies or the central frequency, where each of the acoustic wave devices includes the individual adjustment medium having the ratio according to variation from the desired characteristic. In such a manner, the frequency characteristics of all the acoustic wave devices on the piezoelectric substrate may be adjusted by once patterning the adjustment medium. This reduces the number of film formation steps compared with the case where the frequency characteristics are adjusted by changing the thickness of the adjustment medium. In other words, the frequency characteristics may be adjusted in a small number of steps by forming the adjustment medium such that each of the acoustic wave devices on the piezoelectric substrate has a different area T.

Another example of embodiments may relate to a piezoelectric substrate using as a wafer and the area T of each of the acoustic wave devices may be adjusted such that the resonant frequency, the anti-resonant frequency, or the central frequency of the plurality of acoustic wave devices on the wafer are brought close to a desired frequency. This may provide an acoustic wave device whose frequency variation is low in the wafer.

One another example of embodiments may relate to the acoustic wave devices that comprise a filter including a plurality of resonators formed from a plurality of the interdigital electrodes disposed on the piezoelectric substrate. The adjustment medium may be disposed on a desired number of resonators in the plurality of resonators that compose the filter. The filter characteristics can be minutely adjusted by disposing the adjustment medium on a desired number of the resonators in the filter.

Still another example of embodiments may relate to a method for manufacturing an acoustic wave device in which includes the steps of forming an interdigital electrode having a plurality of electrode fingers on a piezoelectric substrate and measuring the resonant frequency and/or anti-resonant frequency of the acoustic wave device formed from the interdigital electrode. Then, disposing at least one layer of an adjustment medium so as to cover at least part of the interdigital electrode in an excitation region where the electrode fingers and a space between the electrode fingers cover the piezoelectric substrate and the adjustment medium is formed such that the frequency characteristics of the acoustic wave device are adjusted in accordance with an area T of a region where the thickness of the acoustic wave device is larger than that of the other portion due to the adjustment medium. And then, the measured resonant frequency and/or anti-resonant frequency are brought close to a desired frequency.

The embodiments describing a single acoustic resonator or a single piezoelectric resonator may be applied as well to the acoustic wave device, which includes a plurality of the acoustic resonator or the piezoelectric resonator, such a transmission band-pass filter, a reception band-pass filter, a local oscillation filter, an antenna duplexer, an IF filter, and a FM modulator.

(First Embodiment)

[Structure of Acoustic Wave Device]

Figure 1B:
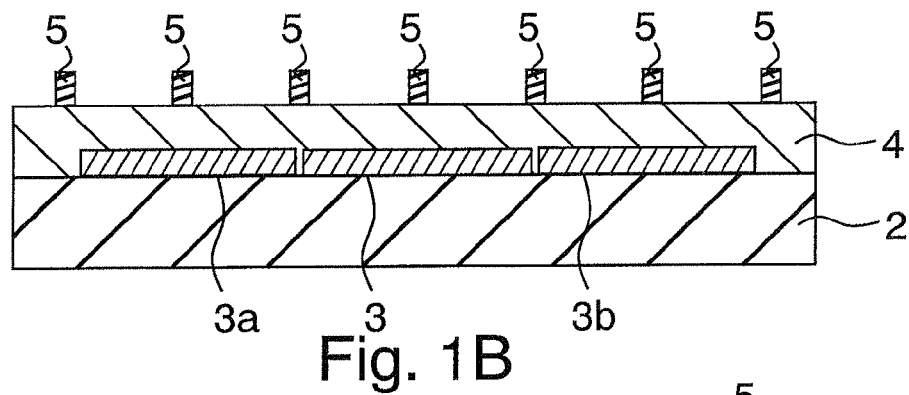
FIG. 1B is a cross sectional diagram of the acoustic wave device along a line a-a' in FIG. 1A.

FIG. 1A is a plan view of an acoustic wave device according to this embodiment. FIG. 1B is a sectional view taken along line a-a' of FIG. 1A.

The acoustic wave device depicted in FIGS. 1A and 1B includes an interdigital electrode 3 having a plurality of electrode fingers on a piezoelectric substrate 2. The interdigital electrode 3 has reflectors 3a and 3b on both sides thereof. The piezoelectric substrate 2 is, for example, a rotated Y-cut LN (LiNbO$_3$) substrate. The interdigital electrode 3 is an electrode for exciting or generating an acoustic wave. The two interdigital electrodes 3 for input and output face each other and are disposed so that the electrode fingers of the two interdigital electrodes 3 are alternately arranged. An excitation region is a region where the electrode fingers of the interdigital electrodes 3 and the space between the electrode fingers cover the piezoelectric substrate 2. The interdigital electrode 3 is also called an IDT electrode or an blind-like electrode. The interdigital electrodes 3 and the reflectors 3a and 3b are formed with a metal such as Al, Ti, Cu, Au, Ni, Cr, Ta, or W.

The interdigital electrodes 3A are covered by SiO$_2$ film 4 on which frequency adjustment films (adjustment media) 5 are disposed. The acoustic velocity in the SiO$_2$ film 4 is lower than that in the piezoelectric substrate 2. Therefore, acoustic waves converge and propagate at an interface between the piezoelectric substrate 2 and the SiO$_2$ film 4. In this way, an acoustic wave device operates as a resonator.

The frequency adjustment films (adjustment media) 5 are made of a material having a different acoustic characteristic from that of SiO$_2$ film 4, such as an acoustic velocity. The frequency adjustment films 5 may be made of Al$_2$O$_3$, SiN, SiC, or Diamond like Carbon (DLC). Alternatively, the frequency adjustment films 5 may be formed with SiO$_2$ having a density, a hardness, or elastic modulus different from that of the SiO$_2$ film 4.

The resonant frequency of the acoustic wave device is adjusted by controlling the area where the SiO$_2$ film 4 is in contact with the frequency adjustment films 5. In other words, the resonant frequency is adjusted in accordance with the area where the thickness of the acoustic wave device is larger than that of the other portion in the excitation region defined by the interdigital electrodes 3. The resonant frequency may be adjusted by the change of the acoustic velocity of an acoustic wave, because a medium having a different acoustic velocity is formed in the portion where the acoustic wave energy is distributed. In this embodiment, the area of the frequency adjustment films 5 determines the volume of the region where the acoustic wave energy is distributed and determines also the adjustment amount of the frequency characteristics, such as a resonant frequency, of the acoustic wave device.

Figure 2A:
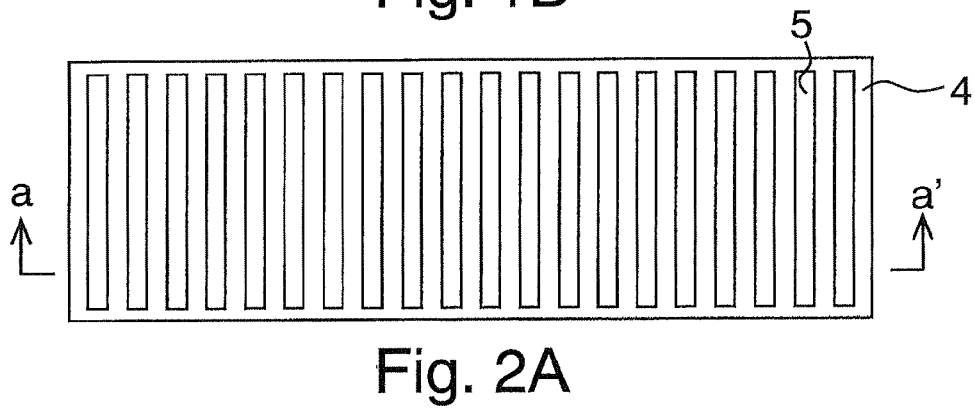
FIG. 2A is an example diagram of a plan view of an acoustic wave device of the first embodiment in the case of an adjustment medium for adjusting frequency covering 50% of an entire the acoustic wave device.
Figure 2B:
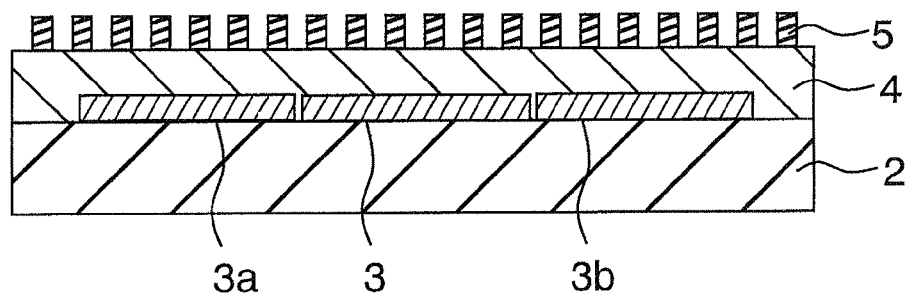
FIG. 2B is a cross sectional diagram of the acoustic wave device along a line a-a' in FIG. 2A.
Figure 3A:
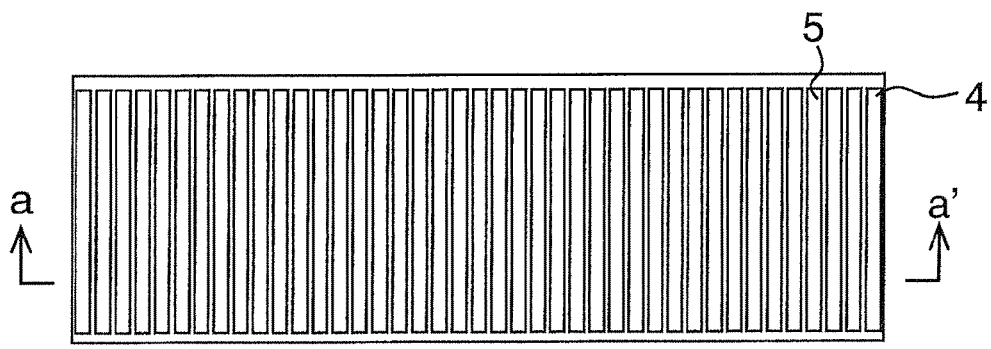
FIG. 3A is an example diagram of a plan view of an acoustic wave device of the first embodiment in the case of an adjustment medium for adjusting frequency covering 75% of an entire the acoustic wave device.
Figure 3B:
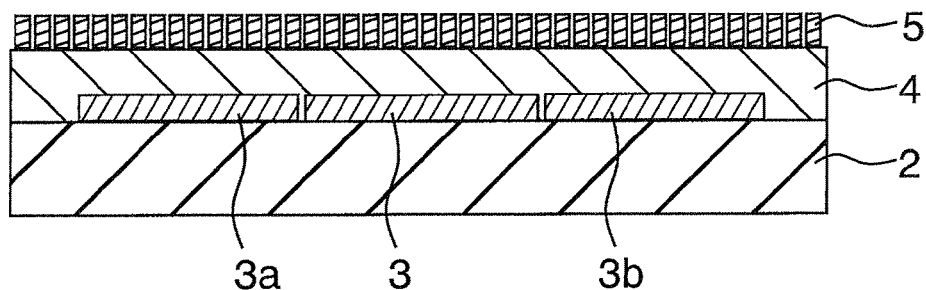
FIG. 3B is a cross sectional diagram of the acoustic wave device along a line a-a' in FIG. 3A.

In the example depicted in FIGS. 1A and 1B, 17% of the entire area of the excitation region is covered by the area where the SiO$_2$ film 4 is in contact with the frequency adjustment films 5 (Al$_2$O$_3$). The thickness of the frequency adjustment films 5 is 50 nm. FIGS. 2A and 2B are respectively a plan view and a sectional view taken along line a-a' of FIG. 2A. FIGS. 2A and 2B depict a structure when 50% of the entire area excitation region is covered by the area where the SiO$_2$ film is in contact with the frequency adjustment films 5. FIGS. 3A and 3B are respectively a plan view and a sectional view taken along line a-a' of FIG. 3A. FIGS. 3A and 3B depicts a structure when 75% of the entire area of the excitation region is covered by the area where the SiO$_2$ film 4 is in contact with the frequency adjustment films 5. Similarly, the thickness of the frequency adjustment films 5 is 50 nm.

Figure 4:
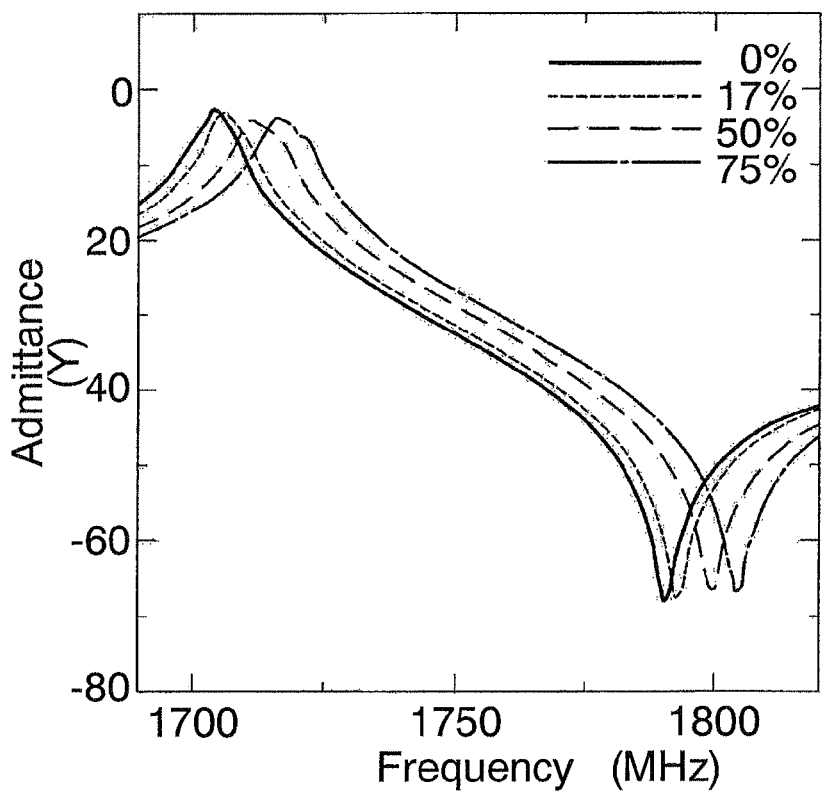
FIG. 4 is a graph depicting admittance curves corresponding to an area of the adjustment medium of respective acoustic wave devices.
Figure 5:
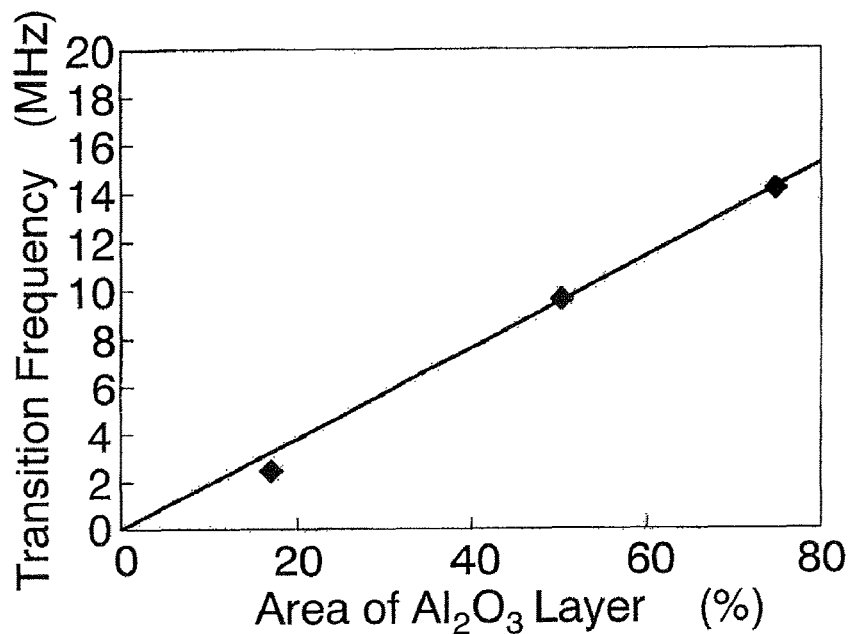
FIG. 5 is a graph depicting a relationship between an area of the adjustment medium for frequency and a shift of an anti-resonant frequency of respective acoustic wave devices.

FIG. 4 is a graph showing an admittance characteristic of each acoustic resonator of which the entire area of excitation area is covered by 0%, 17%, 50%, and 75% respectively by the area where the SiO$_2$ film 4 is in contact with the frequency adjustment films 5 made of Al$_2$O$_3$. In each of the acoustic resonators, the thickness of the frequency adjustment films 5 is 50 nm. FIG. 5 is a graph showing a relationship between the ratio of the areas described above and the transition frequency of each anti-resonant frequency. As evident from FIGS. 4 and 5, the resonant frequency and the anti-resonant frequency shift to higher frequencies as the area where the SiO$_2$ film is in contact with the frequency adjustment films 5 increases. Accordingly, it may be understood that the amount of the frequency shift increases in proportion to the distribution amount of acoustic wave energy or the volume in which the acoustic wave energy is distributed.

In the examples shown in FIGS. 1A to 3B, the frequency adjustment films 5 having a tabular shape are arranged regularly (for example, regularly at intervals of about 2.3 times the distance between the electrode fingers of the interdigital electrodes 3), but are not necessarily arranged in such a regular manner.

[Example of Improvement in Frequency Characteristic Distribution of Acoustic Wave Device on Wafer Plane]

As described above, the frequency characteristics of the acoustic wave device or the acoustic resonator can be adjusted by patterning the frequency adjustment films 5. In this embodiment, an example will be explained for the frequency adjustment of a plurality of acoustic wave devices formed on a single wafer (piezoelectric substrate 2) conducted by patterning the frequency adjustment films 5. In more detail, the example is conducted in a single film formation by adjusting the area of the frequency adjustment films 5 in each of the acoustic wave devices on a wafer in accordance with frequency distribution within the wafer will be described.

Figure 6:
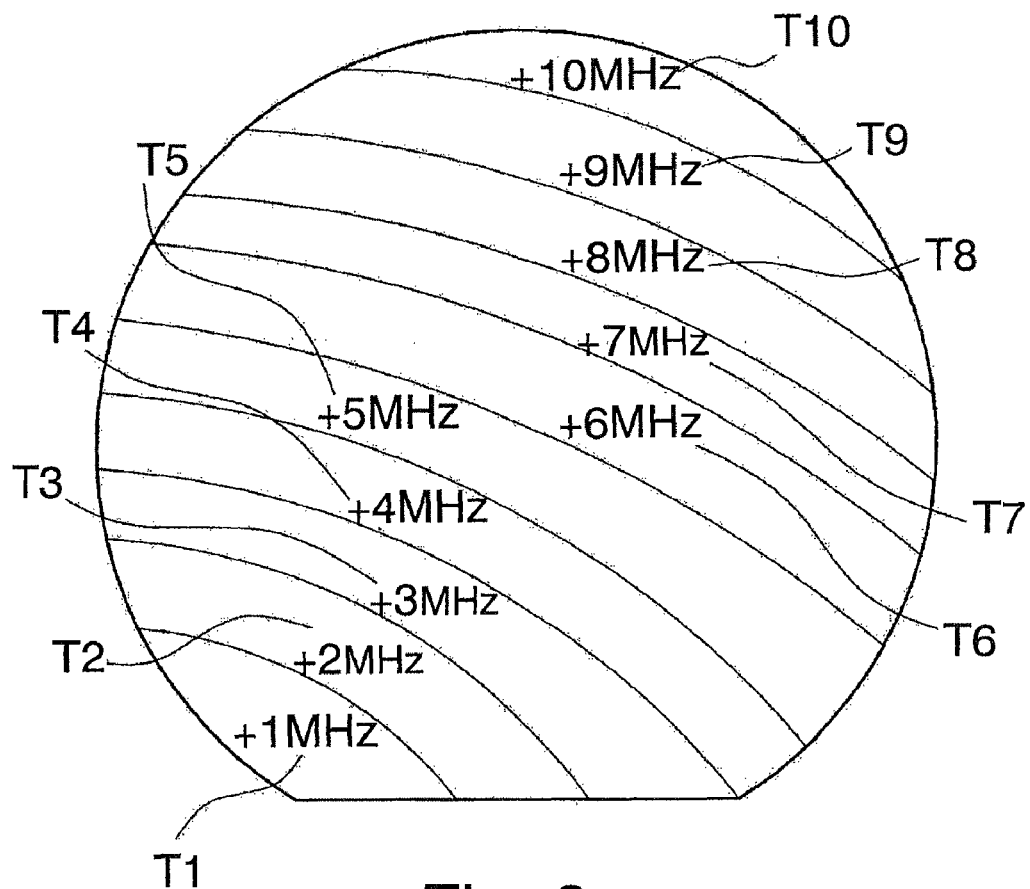
FIG. 6 is a plan view of a wafer depicting deviations of respective characteristic frequency of the acoustic wave devices and a distribution of the deviations.

FIG. 6 is a top view showing a frequency distribution of acoustic wave devices in a wafer plane when the wafer is viewed from above. The frequency distribution may be a distribution of a deviation from a desired resonant or anti-resonant frequency, a desired center frequency in the case of a band-pass filter as the acoustic wave device, or a desired specific frequency around at a rising or falling edge of a frequency characteristic. The wafer shown in FIG. 6 is, for example, a piezoelectric substrate such as an LN (LiNbO$_3$) substrate, and a plurality of interdigital electrodes and a SiO$_2$ film are formed on the piezoelectric substrate. As a result, a plurality of acoustic wave devices that share the wafer (piezoelectric substrate) are formed. At the end, the wafer is separated into each of the acoustic wave devices by cutting. Each of the acoustic wave devices has a structure, for example, shown in FIGS. 1A and 1B, 2A and 2B, or 3A and 3B. Although a case where each of the acoustic wave devices constitutes a single resonator is shown here for convenience of description, for example, the acoustic wave devices may constitute a chip such as a filter that includes a plurality of resonators.

The frequency characteristics (e.g., resonant frequency) of the plurality of acoustic wave devices formed on a wafer is preferably completely the same. In reality, however, the resonant frequency or the like of each of the acoustic wave devices often varies in a wafer plane. When the resonant or anti-resonant frequency shifts from a desired frequency of a acoustic resonator, the frequency shift causes the shift of a desired center frequency of a filter which is synthesized with a plurality of the acoustic wave resonators.

FIG. 6 shows one example of a frequency distribution in such a wafer plane on which a plurality of band-pass filters as the acoustic wave device are fabricated. The example shown in FIG. 6 indicates regions T1 to T10 each of which indicates a range of a frequency deviation of the center frequency of the band-pass filter from the desired frequency. The value +1 MHz in T1 means the center frequencies of the band-pass filters fabricated in the region T1 range from the desired center frequency $f_d$ MHz to $f_d$–0.999 MHz, therefore T2, T10 indicate the ranges of $f_d$ MHz to ($f_d$–1.999) MHz, ($f_d$–10.000) MHz to ($f_d$–10.999) MHz, respectively. Note that the center frequency is a desired frequency that is determined in advance. FIG. 6 shows a frequency distribution before the frequency adjustment films 5 are formed.

Although the above description is given upon a center frequency as an example of frequency characteristics, the frequency characteristics are not limited to this. For example, the frequency characteristics include a resonant frequency, an anti-resonant frequency, a fractional bandwidth, and a specific frequency around at a rising or falling edge of a frequency band. The center frequency of the band-pass filter may be adjusted by the adjustment a resonant or an anti-resonant frequency of the acoustic resonator comprising the band-pass filter.

According to the frequency distribution shown in FIG. 6, the area of the frequency adjustment films is determined and formed on each of the acoustic wave devices in a wafer. Specifically, the frequency adjustment films of each of the acoustic wave devices have preferably a constant thickness and are disposed such that the area covering the interdigital electrode portion. Each area of the frequency adjustment films is determined in accordance with the frequency distribution, for example, each of the acoustic wave devices formed in the region T1 has the frequency adjustment film smaller area than that of the frequency adjustment film acoustic formed on the acoustic wave device in the region T2. In this manner, frequency deviation of each of the acoustic wave devices in the wafer may be properly adjusted so that the frequency characteristic closes to a desired frequency characteristic. That is, the area of the frequency adjustment films may be reduced in the region where the adjustment amount of frequencies is small or may be increased in the region where the adjustment amount of frequencies is large, while the thickness of the frequency adjustment films is constant over the entire wafer. Thus, in the frequency adjustment films, the distribution amount of acoustic wave can be adjusted at a constant film thickness.

Figure 7A:
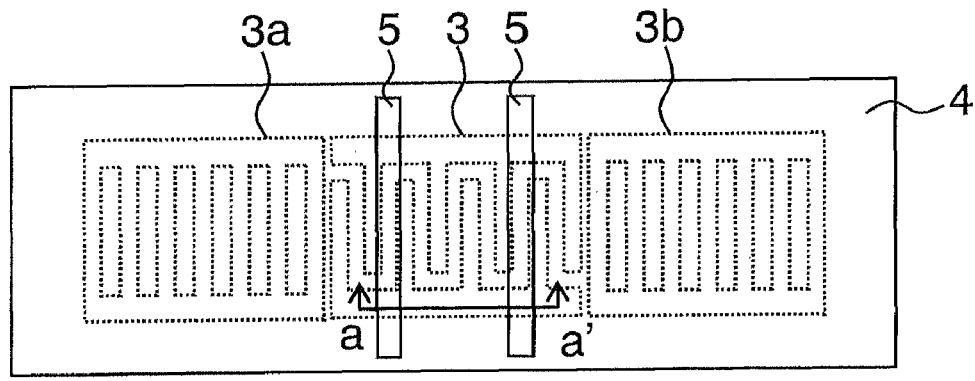
FIG. 7A is an example diagram of a plan view of an acoustic wave device formed on a region T1 of FIG. 6.
Figure 7B:
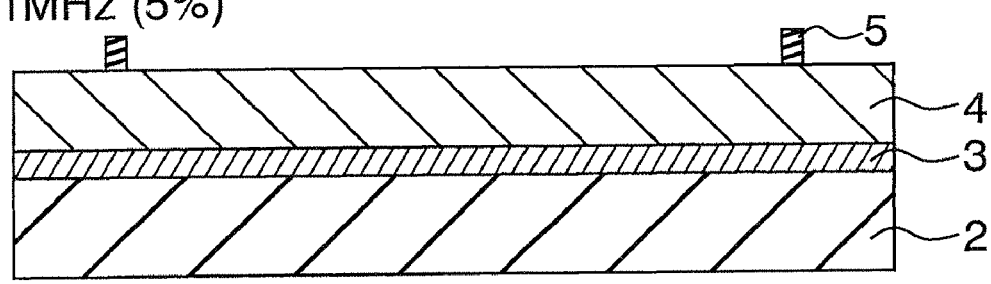
FIG. 7B is a cross sectional diagram of the acoustic wave devices along a line a-a' in FIG. 7A.

FIG. 7A is a plan view of an acoustic wave device formed in the region T1 of the wafer shown in FIG. 6. FIG. 7B is a sectional view taken along line a-a' of FIG. 7A. FIGS. 7B to 7K are respectively sectional views of acoustic wave devices formed in the regions T1 to T10 shown in FIG. 6. As shown in FIGS. 7A and 7B, in the acoustic wave device formed in the region T1, the frequency adjustment films 5 are patterned such that 5% of the area of the excitation region is covered by the frequency adjustment films 5. In the region T1, the center frequency of the pass-band of the acoustic wave device is shifted by +1 MHz (from the desired center frequency). Therefore, by setting the area where the frequency adjustment films 5 cover the excitation region to 5%, the center frequency of the acoustic wave device in the region T1 may be brought close to the desired center frequency. The excitation region is a region where the electrode fingers of the interdigital electrodes 3 and the space between the electrode fingers cover the piezoelectric substrate 2.

Figure 7C:
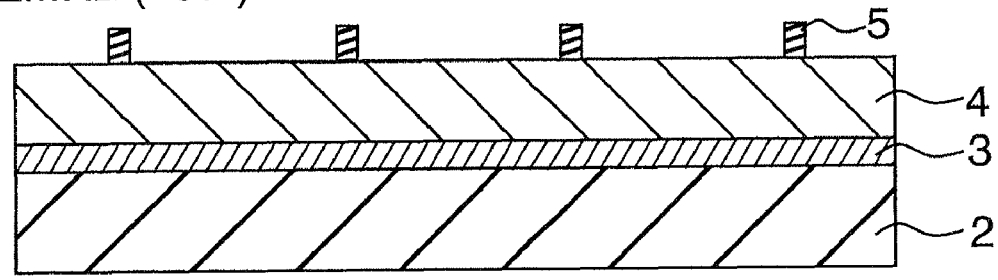
FIGS. 7C to 7K are cross sectional diagrams corresponding to along a line a-a' of respective acoustic wave devices and formed on the regions T2 to T10 respectively.
Figure 7D:
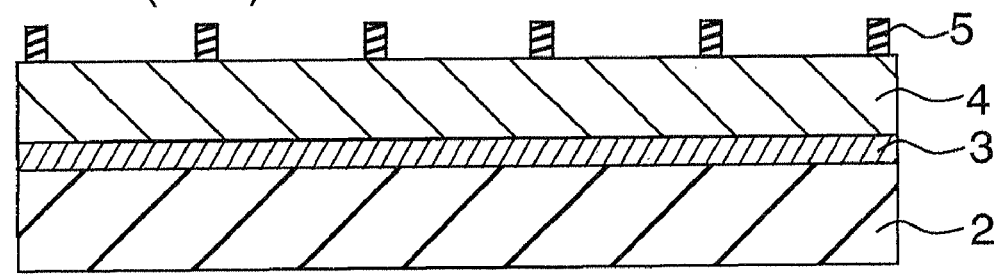
Figure 7E:
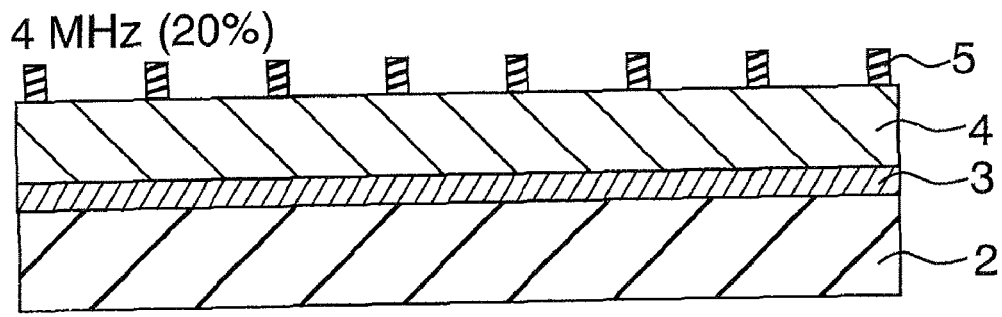
Figure 7F:
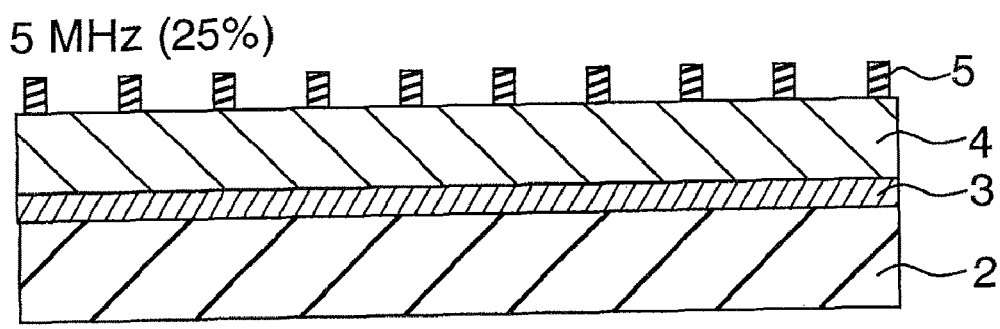
Figure 7G:
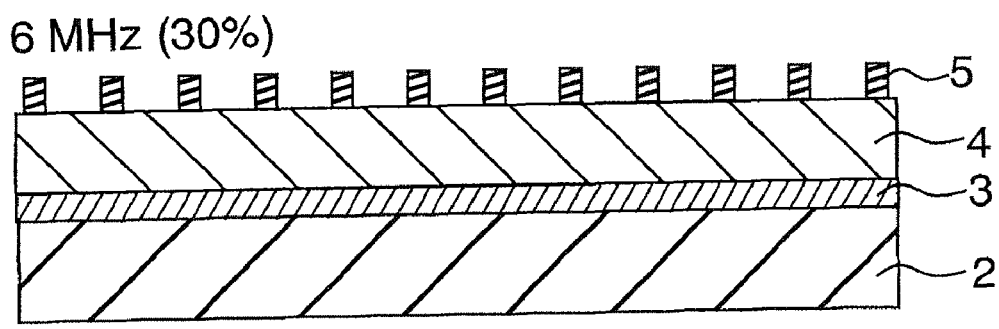
Figure 7H:
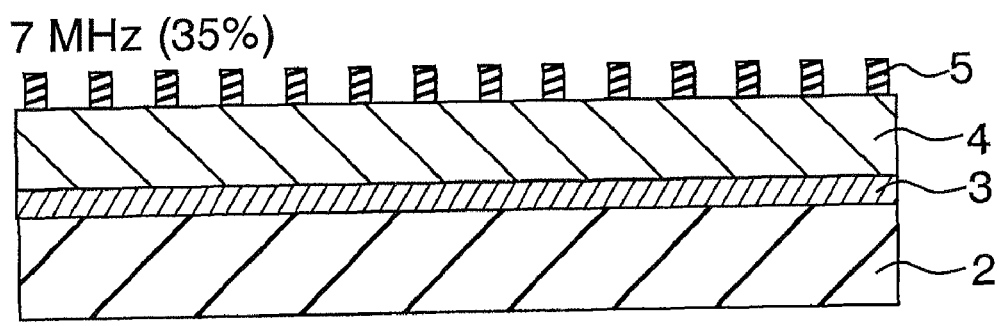
Figure 7I:
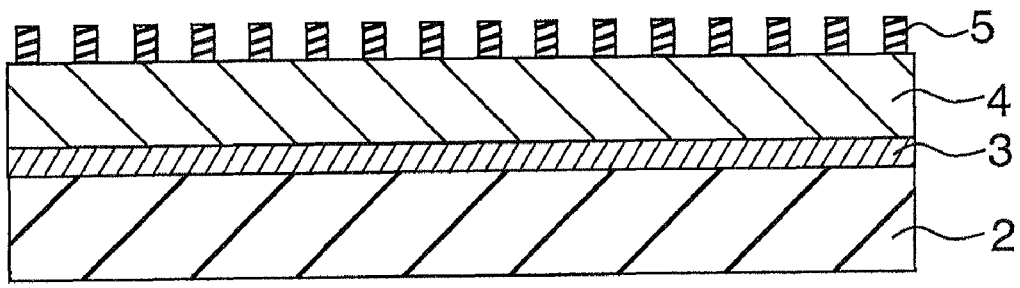
Figure 7J:
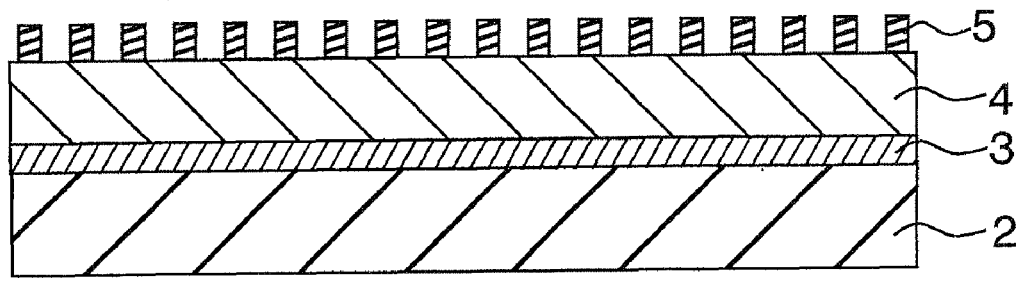
Figure 7K:
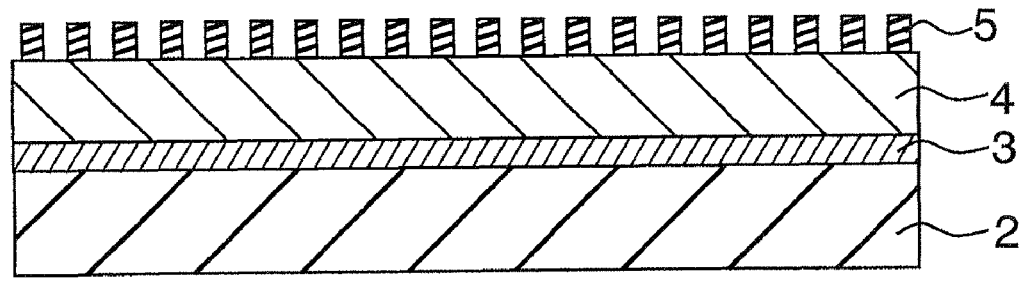

As shown in FIG. 7C, in the region T2, the frequency adjustment films 5 are patterned such that the frequency adjustment films 5 cover 10% area of the excitation region is 10%. As shown in FIGS. 7D to 7K, in the regions T3, T4, T5, T6, T7, T8, T9, and T10, the respective areas where the frequency adjustment films 5 cover the excitation region are 15%, 20%, 25%, 30%, 35%, 40%, 45%, and 50%. All of the frequency adjustment films 5 shown in FIGS. 7A to 7K have a thickness of 50 nm.

As described above, the frequency adjustment films 5 have a constant thickness in a wafer. The ratio of the area where the frequency adjustment films 5 cover the excitation region is adjusted in accordance with the amount of the shift from the center frequency before the frequency adjustment films 5 are formed. In particular, the ratio of the area where the frequency adjustment films 5 cover the excitation region increases in proportion to the amount of the shift from the center frequency in this example. Thus, the frequency characteristics of the acoustic wave device in a wafer can be adjusted without controlling the thickness of the frequency adjustment films 5. Note that the relationship between the area where the frequency adjustment films 5 cover the excitation region and the amount of the shift from the center frequency is not limited to such a proportional relationship.

Furthermore, the areas where the frequency adjustment films 5 cover the excitation region may be different between acoustic resonators in a single wafer or between chips comprising a plurality of the acoustic resonators. In other words, the areas may be adjusted on a acoustic resonator basis, on a chip basis, or on the basis of other purposes.

[Manufacturing Method]

A method for manufacturing the acoustic wave devices shown in FIGS. 6, and 7A to 7K will now be described. FIGS. 8A and 8B show a manufacturing process of an acoustic wave device formed on a wafer. In FIGS. 8A and 8B, only part of the wafer is shown for convenience of description.

In FIG. 8A, interdigital electrodes 3 and reflectors 3a and 3b are first formed on a piezoelectric substrate 2, which is a wafer. The interdigital electrodes 3 and the reflectors 3a and 3b are formed by, for example, vapor deposition or sputtering. Subsequently, a $SiO_2$ film 4 is formed on the entire wafer by, for example, CVD or sputtering so as to cover the interdigital electrodes 3 and the reflectors 3a and 3b. Thus, one acoustic wave device (resonator) is formed in each of regions T11 and T20. After that, electrodes for input and output of the interdigital electrodes 3 are exposed by removing part of the $SiO_2$ film 4 (not shown) on the interdigital electrodes 3.

A test terminal of a wafer probe is then brought into contact with the exposed electrodes to measure a resonant frequency of each of the resonators. For example, the amount of the shift of the resonant frequency of each of the resonators from a desired center frequency is measured. This provides a frequency distribution of the resonators on the wafer. Here, it is assumed as an example that the amount of the shift in the region T11 is +3 MHz and that in the region T20 is +10 MHz.

Next, as shown in FIG. 8B, frequency adjustment films 5 having a pattern corresponding to the frequency distribution are formed. The frequency adjustment films 5 are patterned such that the area of the frequency adjustment films 5 accounts for 15% of the entire area in the region T11 and 50% of the entire area in the region T20. After film formation by, for example, sputtering, the frequency adjustment films 5 can be formed by making a pattern using liftoff or etching. In the patterning, a film that is excellent in terms of having its thickness controlled can be formed by liftoff.

In this embodiment, as described above, the frequency adjustment films 5 have a constant thickness and the area covering the interdigital electrode 3 is determined in accordance with the in-plane distribution of frequency deviation. Consequently, the volume of the frequency adjustment films 5, that is, the adjustment amount of frequencies is adjusted on the basis of the in-plane distribution. Accordingly, the frequency adjustment films 5 are formed by etching after a single film formation. In other words, the in-plane distribution can be improved by etching after a single film formation. As a result, an acoustic wave device in which the in-plane variation of frequencies is reduced can be made in a small number of steps.

(Modification 1)

Figure 9A:
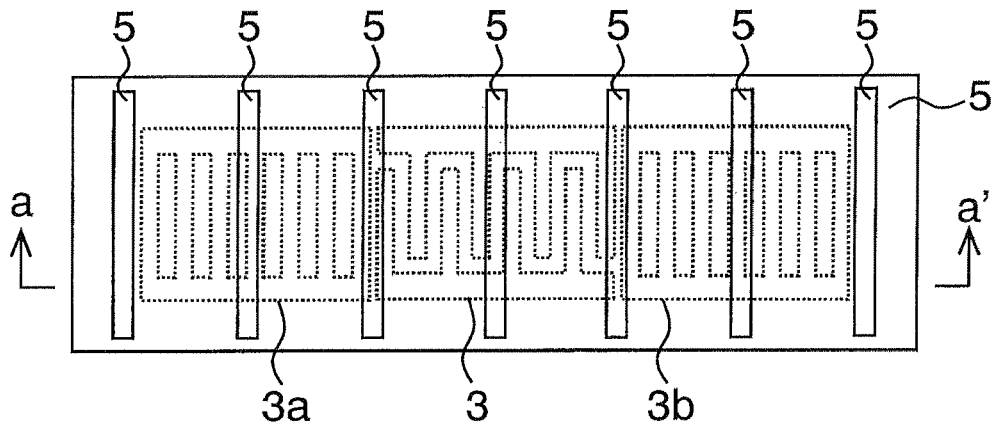
FIG. 9A is a plan view of an acoustic wave device according to a first modification of the first embodiment.
Figure 9B:
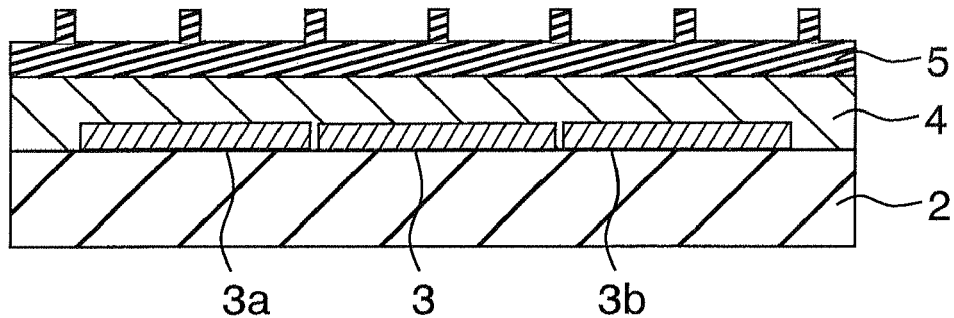
FIG. 9B is a cross sectional diagram of the acoustic wave device along a line a-a' in FIG. 9A.

FIG. 9A is a plan view of an acoustic wave device according to a modification of this embodiment. FIG. 9B is a sectional view taken along line a-a' of FIG. 9A. In the example shown in FIGS. 9A and 9B, the frequency adjustment films 5 having projections are entirely formed on the SiO$_2$ film 4, and a pattern of the projections are formed according to the frequency deviation distribution of the frequency characteristics of the acoustic devices formed on the wafer. In this structure, after the frequency characteristics of the acoustic wave device in a wafer plane are controlled to the center frequency by entirely forming the frequency adjustment films 5, the frequency distribution in the wafer plane can be adjusted. In other words, the in-plane frequency distribution can be adjusted by making a pattern of frequency adjustment films 5 such that the pattern has an area distribution according to the in-plane distribution of frequencies in the wafer.

Regarding the frequency adjustment films 5 having an area distribution, films that are excellent in terms of having their thickness controlled can be formed by making a pattern using liftoff after the film formation by sputtering, compared with using etching.

(Modification 2)

In the embodiment described above, a material of the frequency adjustment films 5 has a higher acoustic velocity than the material of the film (SiO$_2$ film 4) formed below the frequency adjustment films 5. In this case, the resonant frequency (or anti-resonant frequency) of the acoustic wave device shifts to higher frequencies as the area where the SiO$_2$ film 4 is in contact with the frequency adjustment films 5 increases. In contrast, a material having a lower acoustic velocity than the material of the film (SiO$_2$ film 4) formed below the frequency adjustment films 5 may be used for the frequency adjustment films 5. In this case, the resonant frequency (or anti-resonant frequency) of the acoustic wave device shifts to lower frequencies as the area where the SiO$_2$ film 4 is in contact with the frequency adjustment films 5 increases.

For example, a material different from SiO$_2$ such as Au, Cu, Ti, Ag, Pt, Ta, or W may be used for the material having a lower acoustic velocity than the material of the SiO$_2$ film 4. Alternatively, SiO$_2$ having a density, a hardness, or an elastic modulus different from that of the SiO$_2$ film 4 may be used. The heat dissipation of the acoustic wave device may be improved by forming a metal film on a surface.

(Modification 3)

In the embodiment described above, the frequency adjustment films 5 are formed with a single material on a single wafer, but may be formed with two or more kinds of materials. In other words, two kinds of frequency adjustment films 5 that are in contact with the SiO$_2$ film 4 on a single piezoelectric substrate (wafer) 2 can be formed so as to have different acoustic velocities. Among resonators on a wafer, for example, for a resonator whose resonant frequency is higher than the center frequency, the frequency adjustment films 5 can be formed with a material having a higher acoustic velocity than the material of the SiO$_2$ film 4. On the other hand, for a resonator whose resonant frequency is lower than the center frequency, the frequency adjustment films 5 can be formed with a material having a lower acoustic velocity than the material of the SiO$_2$ film 4.

For example, in the case where resonators on a wafer before the frequency adjustment films 5 are formed have the same frequency as a center frequency, it is believed that a region having a frequency higher than the center frequency and a region having a frequency lower than the center frequency coexist in terms of the in-plane distribution of frequencies in the wafer. In such a case, the in-plane distribution can be improved by providing both a frequency adjustment film made of a material having a higher acoustic velocity than SiO$_2$ and a frequency adjustment film made of a material having a lower acoustic velocity than SiO$_2$ on a single wafer.

Accordingly, the distribution of acoustic velocities in the frequency adjustment films 5 can be made to correspond to the frequency distribution of an acoustic wave on a single substrate (wafer). As a result, an acoustic wave device in which the in-plane variation of frequencies is reduced can be made.

(Second Embodiment)

Figure 10A:
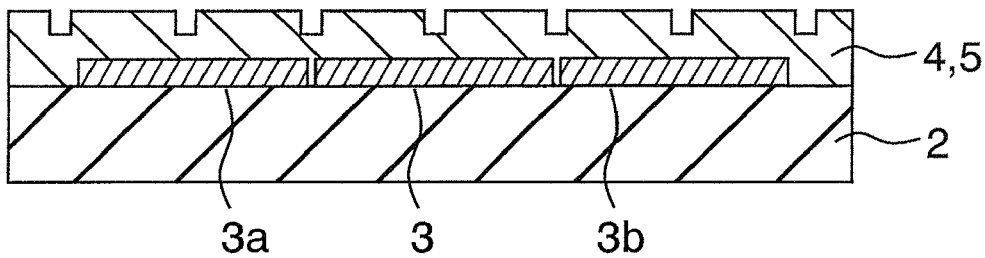
FIG. 10A is an example diagram of a plan view of an acoustic wave device of a second embodiment.
Figure 10B:
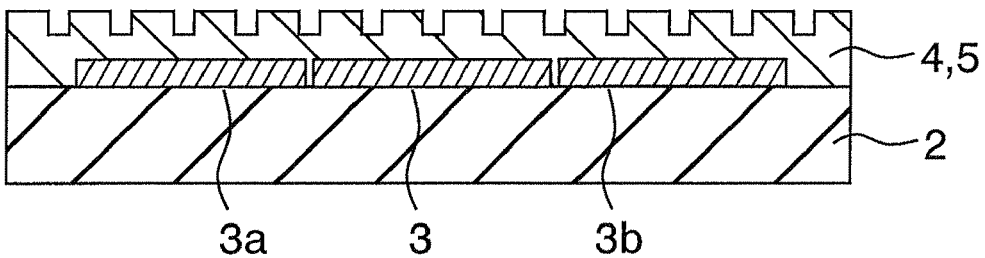
FIG. 10B is a cross sectional diagram of the acoustic wave device along a line a-a' in FIG. 10A.

FIGS. 10A and 10B are sectional views of acoustic wave devices according to the second embodiment. In this embodiment, the SiO$_2$ film 4 is formed on the piezoelectric substrate 2 so as to cover the interdigital electrodes 3 and the reflectors 3a and 3b. The SiO$_2$ partly has thicker portions than the other portions thereof. Consequently, the SiO$_2$ film 4 also has the function of a frequency adjustment film. The structures shown in FIGS. 10A and 10B may be formed by etching part of a SiO$_2$ surface on a single piezoelectric substrate 2. The SiO$_2$ film 4 of FIG. 10B has a larger etched area than the SiO$_2$ film 4 of FIG. 10A. In the examples shown in FIGS. 10A and 10B, the frequency of an acoustic wave shifts to higher frequencies as the etched area becomes large. Since the acoustic wave devices using a wafer, the piezoelectric substrate 2 have the SiO$_2$ film 4 with respective etched areas, the characteristic deviations of the acoustic wave deices may be decreased.

(Third Embodiment)

Figure 11A:
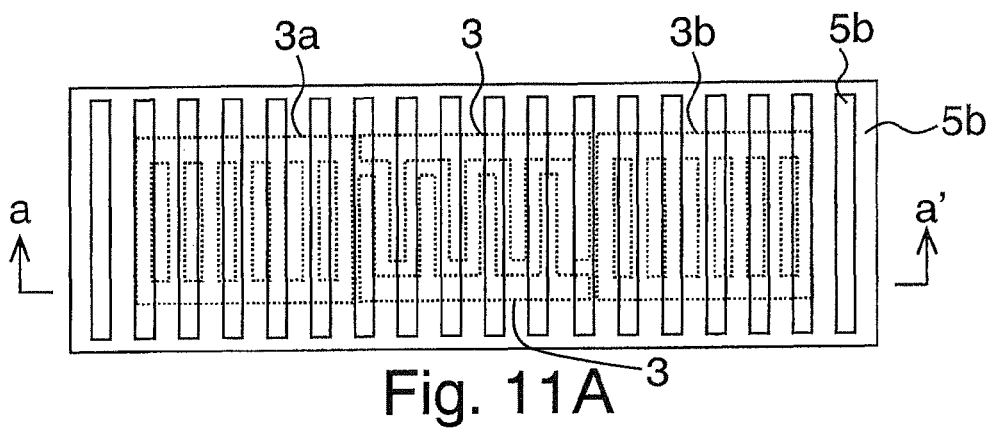
FIG. 11A is an example diagram of a plan view of an acoustic wave device of a third embodiment.
Figure 11B:
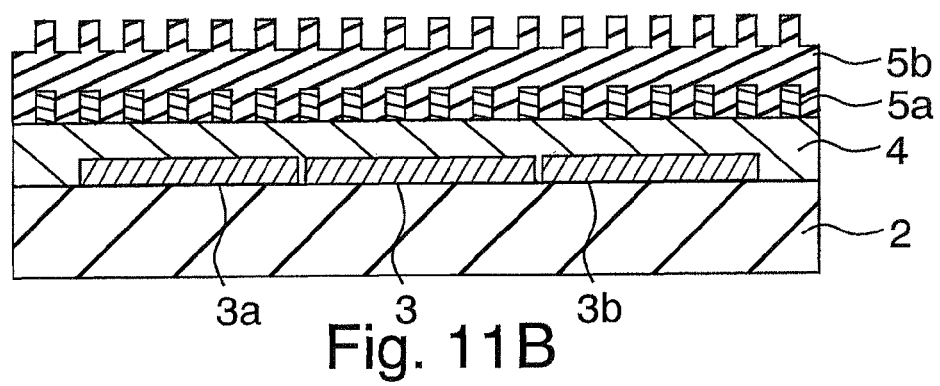
FIG. 11B is a cross sectional diagram of the acoustic wave device along a line a-a' in FIG. 11A.

FIG. 11A is a plan view of an acoustic wave device according to the third embodiment. FIG. 11B is a sectional view taken along line a-a' of FIG. 11A. In the structure shown in FIGS. 11A and 11B, the interdigital electrodes 3 and the reflectors 3a and 3b are formed on the piezoelectric substrate 2. The interdigital electrodes 3 and the reflectors 3a and 3b are made of a conductive material such as Cu. The SiO$_2$ film 4 is formed so as to cover the interdigital electrodes 3 and the reflectors 3a and 3b. Metal films (or insulating films) 5a are formed as a frequency adjustment film on the SiO$_2$ film 4. Furthermore, an insulating film 5b is formed so as to cover the metal films 5a, where the insulating film 5b is made of a material having an acoustic velocity different from the material of the metal films (or insulating films) 5a. The surface shape of the insulating film 5b has a pattern corresponding to the metal films 5a. These frequency adjustment films 5a and 5b provide thicker portions than the other portions in an excitation region. In other words, the portions where the metal films 5a (or insulating films) are in contact with the SiO$_2$ film 4 are thicker than the other portions.

The area where the SiO$_2$ film 4 is in contact with the metal films 5a is 50% of the entire area. The area where the SiO$_2$ film 4 is in contact with the metal films 5a is adjusted in accordance with the frequency distribution of each acoustic wave device on the piezoelectric substrate 2. For example, the frequency shifts to lower frequencies as the ratio of the area where the metal films (or insulating films) 5a made of a material having a lower acoustic velocity than the material of the insulating film 5b cover the SiO$_2$ film 4 increases. In contrast, the frequency shifts to higher frequencies as the ratio of the area where the metal films (insulating films) 5a made of a material having a higher acoustic velocity than the material of the insulating film 5b cover the SiO$_2$ film 4 increases. Examples of the insulating films 5a and 5b include SiN, Al$_2$O$_3$, SiC, and DLC. Examples of the metal films 5a include conductive materials such as Au, Al, Cu, Ti, Ag, Pt, Ta, and W.

Figure 12A:
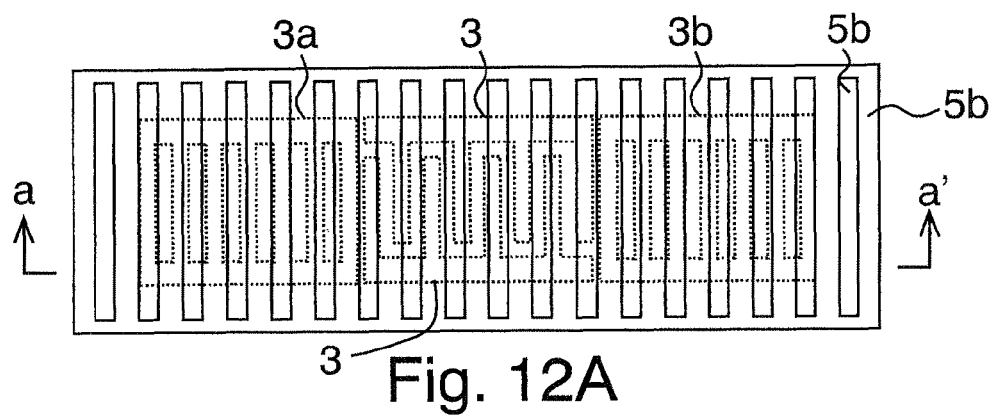
FIG. 12A is a plan view of an acoustic wave device according to a modification of the third embodiment.
Figure 12B:
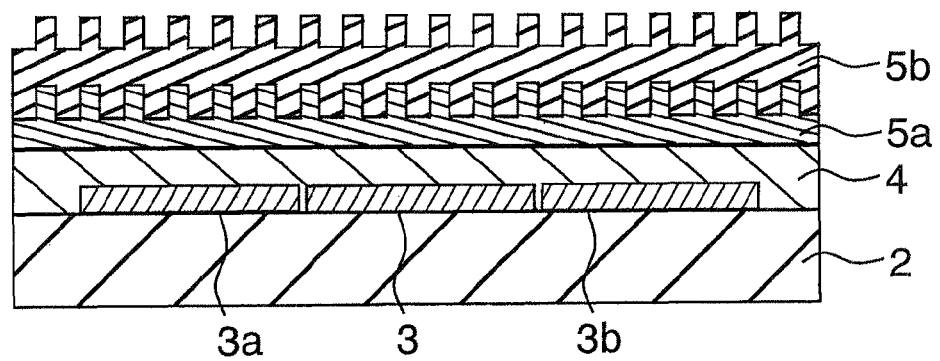
FIG. 12B is a cross sectional diagram of the acoustic wave device along a line a-a' in FIG. 12A.

FIG. 12A is a plan view of an acoustic wave device according to a modified example of the third embodiment. FIG. 12B is a sectional view taken along line a-a' of FIG. 12A. As shown in FIGS. 12A and 12B, the metal film 5a may cover the entire SiO$_2$ film 4 and a pattern for adjusting frequencies may be further formed thereon. After the resonant frequency of each of the resonators is brought close to the center frequency by forming the metal film 5a on the entire SiO$_2$ film 4 (100%), a pattern having an area distribution according to the in-plane distribution of resonant frequencies of the resonators can be formed. As a result, the frequency distribution of each of the resonators (or chips) in a piezoelectric substrate 2 plane can be adjusted.

Figure 13A:
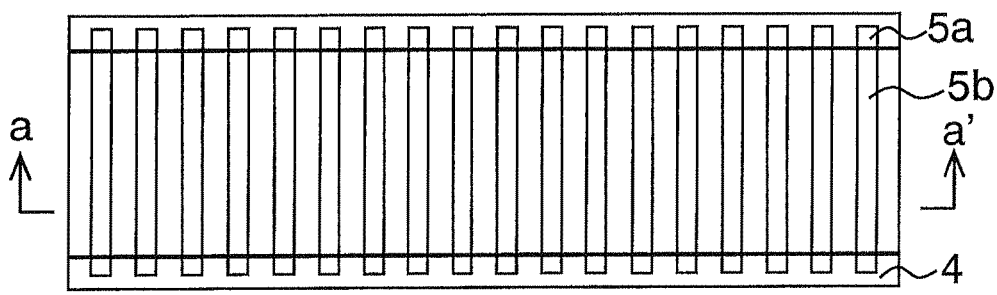
FIG. 13A is a plan view of an acoustic wave device according to another modification of the third embodiment.
Figure 13B:
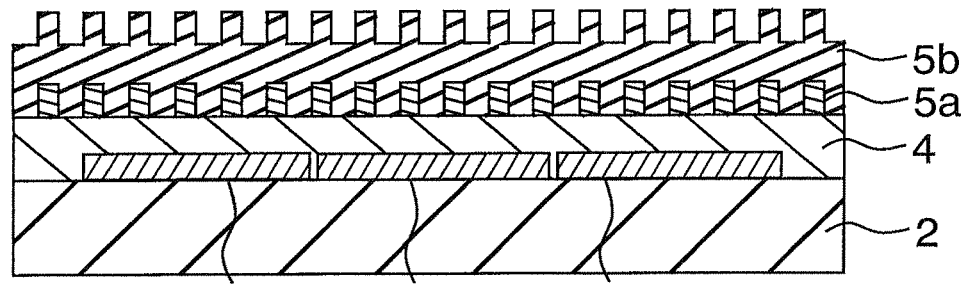
FIG. 13B is a cross sectional diagram of the acoustic wave device along a line a-a' in FIG. 13A.

FIG. 13A is a plan view of an acoustic wave device according to a modified example of the third embodiment. FIG. 13B is a sectional view taken along line a-a' of FIG. 13A. As shown in FIGS. 13A and 13B, the heat dissipation of the acoustic wave device can be improved by forming the metal films 5a such that the metal films 5a are exposed outside the Al$_2$O$_3$ film 5b.

The film disposed on the metal films may be formed so as to achieve different acoustic velocities in accordance with the positions corresponding to the frequency distribution on the piezoelectric substrate 2. For example, it is believed that a region having a frequency higher than the center frequency and a region having a frequency lower than the center frequency coexist in terms of an in-plane distribution of frequencies in the piezoelectric substrate. In such a case, the in-plane distribution can be improved by providing both a frequency adjustment film made of a material having a higher acoustic velocity than the SiO$_2$ film 4 and a frequency adjustment film made of a material having a lower acoustic velocity than the SiO$_2$ film 4.

(Fourth Embodiment)

Figure 14A:
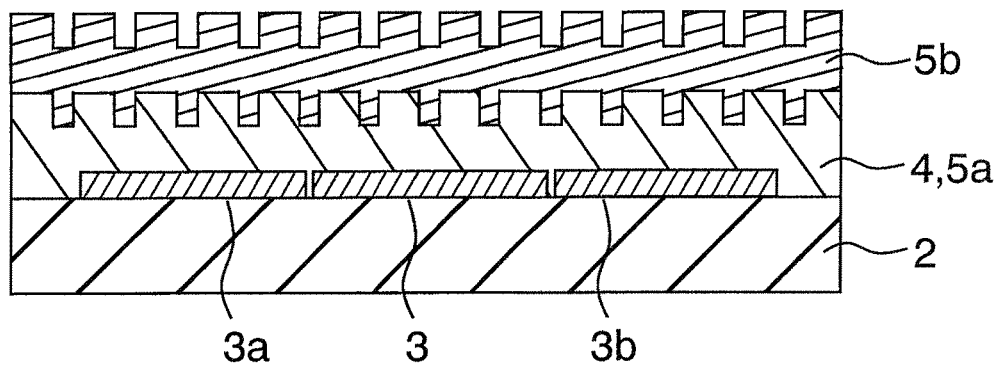
FIGS. 14A and 14B are cross sectional diagrams of acoustic wave devices according to a fourth embodiment.
Figure 14B:
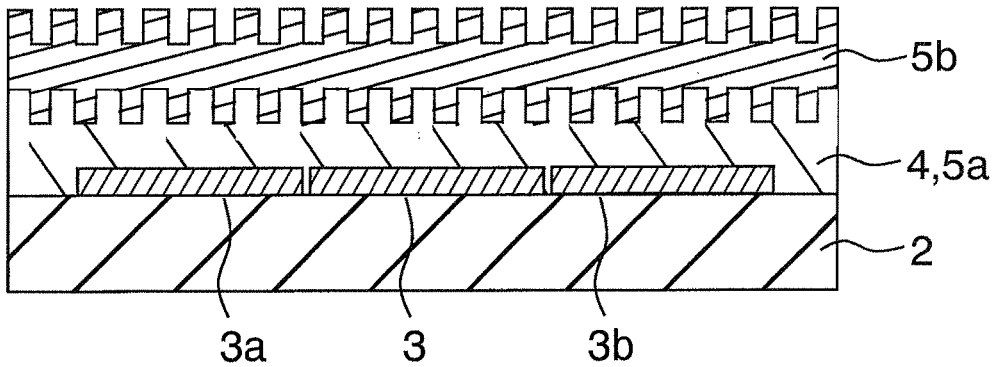

FIGS. 14A and 14B are sectional views of acoustic wave devices according to the fourth embodiment. In the structures shown in FIGS. 14A and 14B, the SiO$_2$ film 4 is formed on the piezoelectric substrate 2 so as to cover the interdigital electrodes 3 and the reflectors 3a and 3b, where the SiO$_2$ film 4 partly has thicker portions than the other portions thereof. Furthermore, the Al$_2$O$_3$ film 5b is formed so as to cover the SiO$_2$ film 4. On the surface of the Al$_2$O$_3$ film 5b, the pattern of the SiO$_2$ film 4 is reflected. The ratio of the area where thicker portions exist on a SiO$_2$ surface to the entire area is higher in FIG. 14A than in FIG. 14B. The frequency of the acoustic wave device is adjusted in accordance with the ratio of the area. In the structures shown in FIGS. 14A and 14B, the SiO$_2$ film 4 also has the function of a frequency adjustment film.

The area where thicker portions exist on a SiO$_2$ surface can be adjusted on the basis of, for example, the etched area of the SiO$_2$ film 4. Accordingly, a boundary acoustic wave device in which the in-plane variation of frequencies is reduced can be made by changing the etched area of the SiO$_2$ film 4 on a single piezoelectric substrate 2.

(Fifth Embodiment)

Figure 15A:
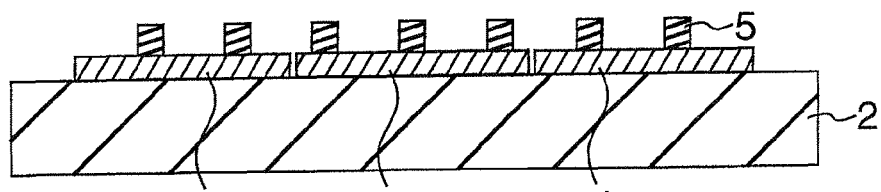
FIGS. 15A and 15B are cross sectional diagrams of acoustic wave devices according to a fifth embodiment.
Figure 15B:
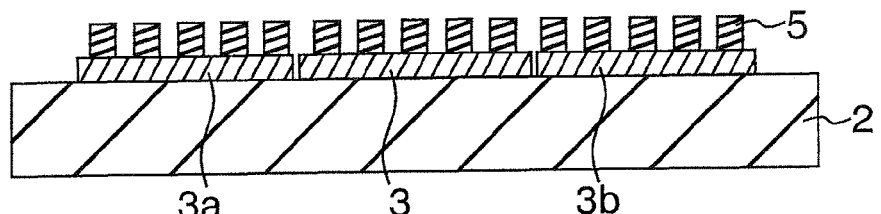

FIGS. 15A and 15B are sectional views of surface acoustic wave devices according to an example of the fifth embodiment. In these surface acoustic wave devices, the interdigital electrodes 3 and the reflectors 3a and 3b are formed on the piezoelectric substrate 2, where the interdigital electrodes 3 and the reflectors 3a and 3b made of a conductive material such as Al. On the interdigital electrodes 3 and the reflectors 3a and 3b, the frequency adjustment films 5 are formed. The frequencies of the surface acoustic wave devices are adjusted in accordance with the ratio of the area where the frequency adjustment films 5 are formed to the entire area. The ratio of the area where the frequency adjustment films 5 are formed to the entire area is higher in FIG. 15B than in FIG. 15A. For example, SiO$_2$ is used as a material of the frequency adjustment films 5. In this case, the frequency shifts to lower frequencies as the ratio of the area where the frequency adjustment films 5 cover the excitation region increases. Accordingly, a surface acoustic wave device in which the in-plane variation of frequencies is reduced can be made by changing the area of the frequency adjustment films 5 on a single piezoelectric substrate 2.

Figure 16A:
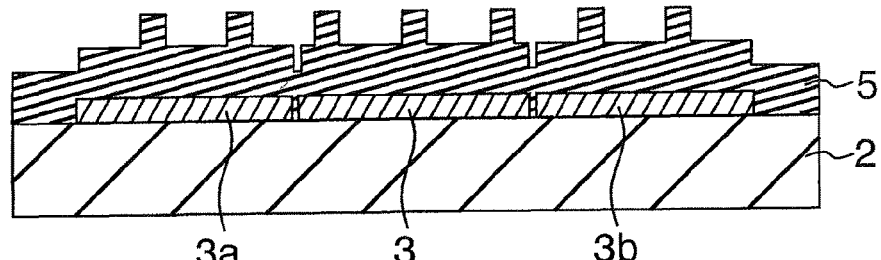
FIGS. 16A and 16B are cross sectional diagrams of acoustic wave devices according to modifications of the fifth embodiment.
Figure 16B:
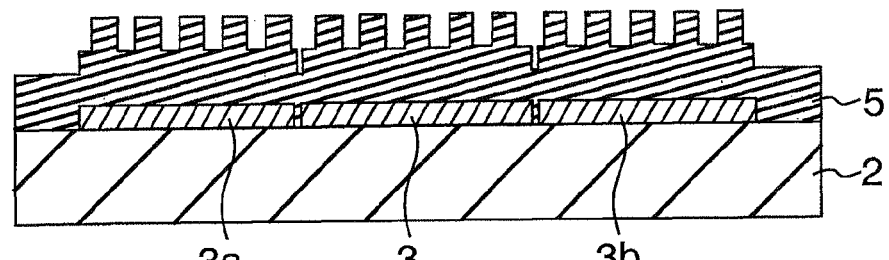

FIGS. 16A and 16B are sectional views of surface acoustic wave devices according to an example of the fifth embodiment. As shown in FIGS. 16A and 16B, the frequency adjustment films 5 may cover the entire piezoelectric substrate 2 and a pattern for adjusting frequencies may be further formed thereon. After the resonant frequency of each of the resonators is brought close to the center frequency by forming the SiO$_2$ film on the entire piezoelectric substrate 2 (100%), a pattern having an area distribution according to the in-plane distribution of resonant frequencies of the resonators can be formed thereon. As a result, the frequency distribution of each of the resonators (or chips) in a piezoelectric substrate 2 plane can be adjusted.

(Sixth Embodiment)

Figure 17A:
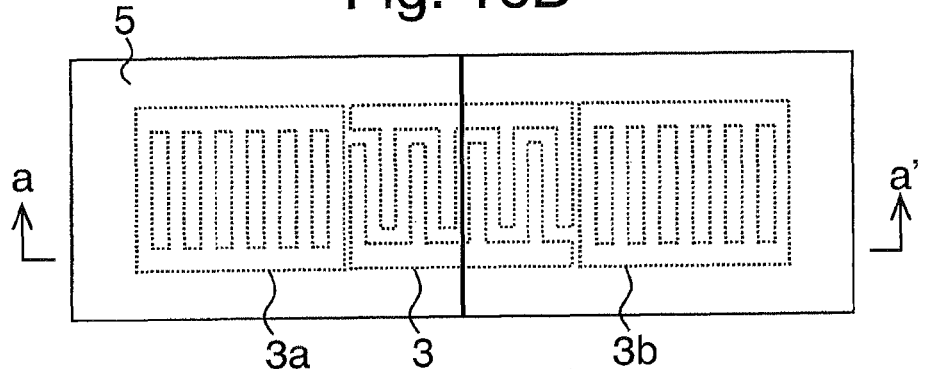
FIG. 17A is a plan view of an acoustic wave device according to a sixth embodiment.
Figure 17B:
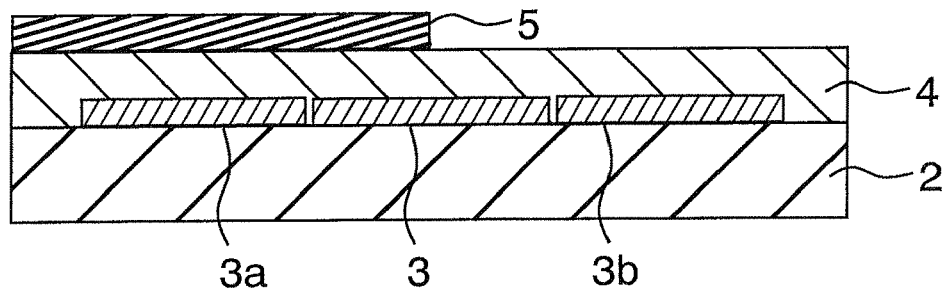
FIG. 17B is a cross sectional diagram of the acoustic wave device along a line a-a' in FIG. 17A.

FIG. 17A is a plan view of an acoustic wave device according to an example of the third embodiment. FIG. 17B is a sectional view taken along line a-a' of FIG. 17A. In the example shown in FIGS. 17A and 17B, the frequency adjustment film 5 is disposed so as to be in contact with a left half of the entire surface of the SiO$_2$ film 4. In this case, the ratio of the area where the frequency adjustment film 5 covers the SiO$_2$ film 4 is 50%. Thus, the ratio of the area where the frequency adjustment film 5 covers the excitation region is also 50%. The frequency adjustment film 5 is formed with a thickness of, for example, 50 nm.

In the first to fifth embodiments, the frequency adjustment films 5 have been patterned such that the thicker portions than the other portions are equally distributed. As shown in FIGS. 17A and 17B, however, the frequency adjustment film 5 may be disposed at one portion. In this case also, the frequency of the acoustic wave device is adjusted by controlling the area of the frequency adjustment film 5.

In the case where the frequency adjustment film 5 is thick, the characteristics may deteriorate due to the generation of an unwanted wave around the resonant frequency when the frequency adjustment film 5 is disposed at one portion as shown in FIGS. 17A and 17B. In this case, as described in the first to fifth embodiments, the deterioration of the characteristics may be prevented by dispersively disposing the frequency adjustment films 5 in the excitation region. The frequency adjustment films 5 may be regularly (periodically) or irregularly (randomly) arranged.

(Seventh Embodiment)

Figure 18:
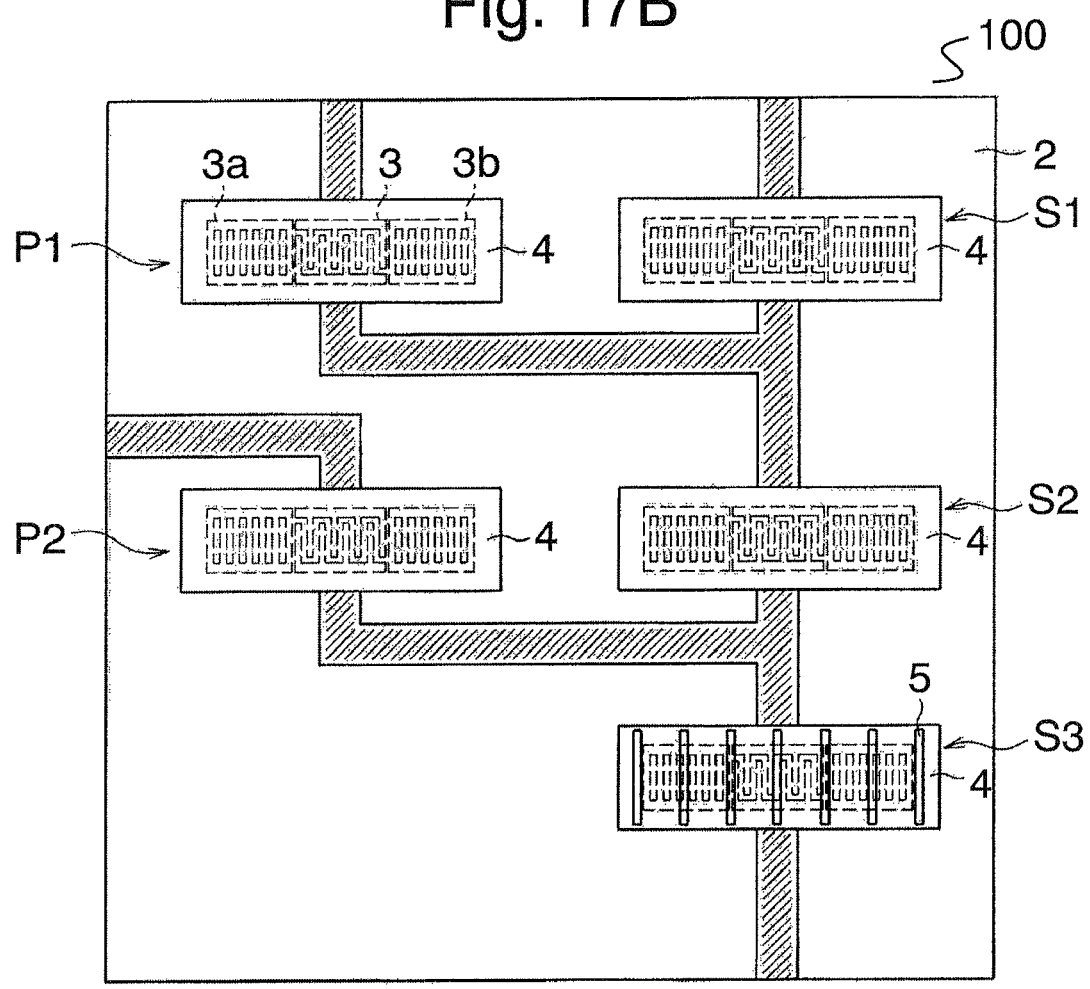
FIG. 18 is a plan view of a ladder filter as an acoustic wave device according to a seventh embodiment.

FIG. 18 is a plan view of acoustic wave device 100 constituting a ladder filter according to an example of the seventh embodiment. The acoustic wave device 100 includes a plurality of resonators and conductive patterns which connect the resonators. A plurality of the acoustic wave devices 100 are fabricated on a wafer which may be used as a substrate of the acoustic wave devices 100. Each resonators includes a piezoelectric substrate 2, interdigital electrodes 3 and reflectors 3a and 3b, and SiO$_2$ film 4, where the interdigital electrodes 3 and reflectors 3a and 3b are formed on the piezoelectric substrate 2. The piezoelectric substrate 2 is common to each of the resonators, the SiO$_2$ film 4 is formed so as to cover at least the interdigital electrodes 3 and reflectors 3a and 3b. The acoustic wave device 100 as the ladder filter includes series resonators S1 to S3, parallel resonators P1 and P2, and a wiring pattern for connecting these resonators.

In the example depicted FIG. 18, the frequency adjustment films 5 are disposed so as to be in contact with the SiO$_2$ film 4 in the series resonator S3 among the plurality of resonators S1 to S3, P1, and P2 constituting the filter. By disposing the frequency adjustment films 5 on a desired number of the resonators constituting the filter in this manner, only the frequency of the desired number of the resonators can be adjusted. Accordingly, the fractional bandwidth of the filter can be adjusted by controlling only the frequency of a desired number of the resonators. This can reduce the shift of a fractional bandwidth in a plane.

For example, in a ladder filter, the frequencies of the resonators may be different. For example, in the case where a resonator having the highest anti-resonant frequency among series resonators shows increasing characteristics of the filter, the fractional bandwidth can be increased or decreased by adjusting only the frequency of the resonator.

The number of resonators on which the frequency adjustment films 5 are disposed is not limited to the example shown in FIG. 18, and the frequency adjustment films 5 may be disposed on a plurality of resonators among resonators S1 to S3, P1, and P2. In this case, the filter characteristics can be further adjusted by providing a structure in which the frequency adjustment films 5 on each of the resonators have a different area.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A ladder filter, comprising a plurality of acoustic wave devices, at least two of the plurality of acoustic wave devices each including,
    a substrate made of a piezoelectric material,
    a pair of interdigital electrodes formed on the substrate, each of the interdigital electrodes including a plurality of electrode fingers, and
    an adjustment medium including at least a single layer and formed on at least a part of the pair of the interdigital electrodes, the adjustment medium including at least one thick portion and a thin portion, the thin portion being null or thinner than the thick portion, the at least one thick portion and the thin portion both being formed on the pair of the interdigital electrodes, a total area of the at least one thick portion in a region covering the pair of interdigital electrodes being determined according to a predetermined characteristic value,
    wherein said at least two of the plurality of acoustic wave devices include at least two acoustic wave devices that differ from each other with respect to the size of the total area of the at least one thick portion of the adjustment medium.

2. A transmission apparatus comprising a plurality of acoustic wave devices, at least two of the plurality of the acoustic wave devices each including,
    a substrate made of a piezoelectric material,
    a pair of interdigital electrodes formed on the substrate, each of the interdigital electrodes including a plurality of electrode fingers, and
    an adjustment medium including at least a single layer and formed on at least a part of the pair of the interdigital electrodes, the adjustment medium including at least one thick portion and a thin portion, the thin portion being null or thinner than the thick portion, the at least one thick portion and the thin portion both being formed on the pair of the interdigital electrodes, a total area of the at least one thick portion in a region covering the pair of interdigital electrodes being determined according to a predetermined characteristic value,
    wherein said plurality of acoustic wave devices include at least two acoustic wave devices that differ from each other with respect to the size of the total area of the at least one thick portion of the adjustment medium.

3. A method of manufacturing an acoustic wave device, comprising:
    forming on a piezoelectric substrate a pair of interdigital electrodes, each of the interdigital ectrodes including a plurality of electrode fingers;
    measuring at least one of a resonant frequency and an antiresonant frequency of an acoustic wave device including the pair of interdigital electrodes; and
    forming an adjustment medium, the adjustment medium including at least a single layer and formed on at least a part of the pair of the interdigital electrodes, the adjustment medium including at least one thick portion and a thin portion, the thin portion being null or thinner than the thick portion, the at least one thick portion and the thin portion both being formed on the pair of the interdigital electrodes, a total area of the at least one thick portion in a region covering the pair of interdigital electrodes being determined so that a measured value of the resonant frequency or the antiresonant frequency is equal to or close to a predetermined value of a frequency,
    wherein the above steps are performed to form a plurality of acoustic wave devices, and said plurality of acoustic wave devices include at least two acoustic wave devices that differ from each other with respect to the size of the total area of the at least one thick portion of the adjustment medium.

4. An acoustic wave device, comprising:
    a plurality of acoustic wave devices each including,
        a substrate made of a piezoelectric material,
        a pair of interdigital electrodes formed on the substrate, each of the interdigital electrodes including a plurality of electrode fingers, and
        an adjustment medium including at least a single layer and formed on at least a part of the pair of the interdigital electrodes, the adjustment medium including at least one thick portion and a thin portion, the thin portion being null or thinner than the thick portion, a total area of the at least one thick portion in a region covering the pair of interdigital electrodes being determined according to a predetermined characteristic value,
    wherein said plurality of acoustic wave devices include at least two acoustic wave devices that differ from each other with respect to the size of the total area of the at least one thick portion of the adjustment medium,
    wherein each of the areas of the at least one of the thick portions is determined so that respective resonant frequencies or antiresonant frequencies of the respective acoustic wave devices are equal to or close to respective predetermined frequencies,
    wherein in each of the plurality of the acoustic wave devices, the adjustment medium includes a first medium formed entirely over the pair of the interdigital electrodes, in some of the plurality of the second acoustic wave devices, the adjustment medium includes a second medium partly formed on the first medium, and in each of the others of the plurality of the acoustic wave devices, the adjustment medium includes a third medium partly formed on the first medium, the third medium having an acoustic velocity different from an acoustic velocity of the second medium, and individual areas of the second medium and the third medium with respect to the first medium are determined so that respective resonant frequencies or antiresonant frequencies of the respective acoustic wave devices are equal to or close to respective predetermined frequencies, and wherein an acoustic velocity of the first medium is lower than the acoustic velocity of the second medium and higher than the velocity of the third medium.

5. An acoustic wave device, comprising:
a plurality of acoustic wave devices each including,
a substrate made of a piezoelectric material,
a pair of interdigital electrodes formed on the substrate, each of the interdigital electrodes including a plurality of electrode fingers, and
an adjustment medium including at least a single layer and formed on at least a part of the pair of the interdigital electrodes, the adjustment medium including at least one thick portion and a thin portion, the thin portion being null or thinner than the thick portion, the at least one thick portion and the thin portion both being formed on the pair of the interdigital electrodes, a total area of the at least one thick portion in a region covering the pair of interdigital electrodes being determined according to a predetermined characteristic value,
wherein said plurality of acoustic wave devices include at least two acoustic wave devices that differ from each other with respect to the size of the total area of the at least one thick portion of the adjustment medium.

6. The acoustic wave device according to claim 5, wherein each of the areas of the at least one of the thick portions is determined so that respective resonant frequencies or antiresonant frequencies of the respective acoustic wave devices are equal to or close to respective predetermined frequencies.

7. The acoustic wave device according to claim 6, wherein the substrate is common among the plurality of acoustic wave devices and is a wafer.

8. The acoustic wave device according to claim 5, wherein the adjustment medium includes a first medium formed entirely over the pair of the interdigital electrodes and a second medium which is formed at least partially on the first medium, and an area of the second medium with respect to the first medium is determined according to the predetermined characteristic value.

9. The acoustic wave device according to claim 8, wherein the adjustment medium includes a third medium formed on the second medium.

10. The acoustic wave device according to claim 6, wherein in each of the plurality of the acoustic wave devices, the adjustment medium includes a first medium formed entirely over the pair of the interdigital electrodes, in some of the plurality of the second acoustic wave devices, the adjustment medium includes a second medium partly formed on the first medium, and in each of the others of the plurality of the acoustic wave devices, the adjustment medium includes a third medium partly formed on the first medium, the third medium having an acoustic velocity different from an acoustic velocity of the second medium, and individual areas of the second medium and the third medium with respect to the first medium are determined so that respective resonant frequencies or antiresonant frequencies of the respective acoustic wave devices are equal to or close to respective predetermined frequencies.

11. The acoustic wave device according to claim 10, wherein in each of the plurality of the acoustic wave devices, the adjustment medium further comprises a fourth medium formed on the respective second or third medium.

12. The acoustic wave device according to claim 5, wherein the adjustment medium includes a layer having at least one protrusion on its surface that corresponds to the at least one thick portion.

13. The acoustic wave device according to claim 12, wherein the adjustment medium further includes another medium having a uniform thickness on said plurality of interdigital electrodes under said layer having the at least one protrusion.

14. The acoustic wave device according to claim 13, further comprising a medium formed over the layer having the at least one protrusion.

15. The acoustic wave device according to claim 5, wherein a material of the interdigital electrodes includes one of aluminum, titanium, copper, gold, nickel, chromium, tantalum, and tungsten.

16. The acoustic wave device according to claim 5, wherein the adjustment medium includes $SiO_2$, $Al_2O_3$, SiN, or Diamond like Carbon as a main ingredient.

17. The acoustic wave device according to claim 5, wherein the piezoelectric material is one of $LiTaO_3$ substrate and $LiNbO_3$ substrate.

* * * * *